United States Patent [19]

Avalon et al.

[11] 4,227,289
[45] Oct. 14, 1980

[54] AUTOMATION SYSTEM FOR MOUNTING FILM SEGMENTS INTO FIXTURES

[75] Inventors: Max Avalon; John L. Kowalski, both of Phoenix; K. Boyd Tippetts, Glendale, all of Ariz.

[73] Assignee: Honeywell Information Systems Inc., Phoenix, Ariz.

[21] Appl. No.: 921,638

[22] Filed: Jul. 3, 1978

[51] Int. Cl.³ ............................................. B23Q 7/00
[52] U.S. Cl. .................................. 29/33 K; 29/564.6; 29/740
[58] Field of Search .................. 29/33 K, 33 M, 33 S, 29/33 Q, 564.1, 564.2, 564.6, 564.7, 564.8, 740

[56] References Cited

U.S. PATENT DOCUMENTS

| 3,274,665 | 9/1966 | Higginson et al. | 29/564.6 X |
| 4,079,489 | 3/1978 | Kowalski et al. | 29/33 K |

Primary Examiner—Gil Weidenfeld
Attorney, Agent, or Firm—E. W. Hughes; W. W. Holloway, Jr.; R. T. Reiling

[57] ABSTRACT

An automation system for cutting segments from a strip of film wound on a reel, mounting the segments in reusable fixtures and stacking the fixtures in a magazine.

9 Claims, 8 Drawing Figures

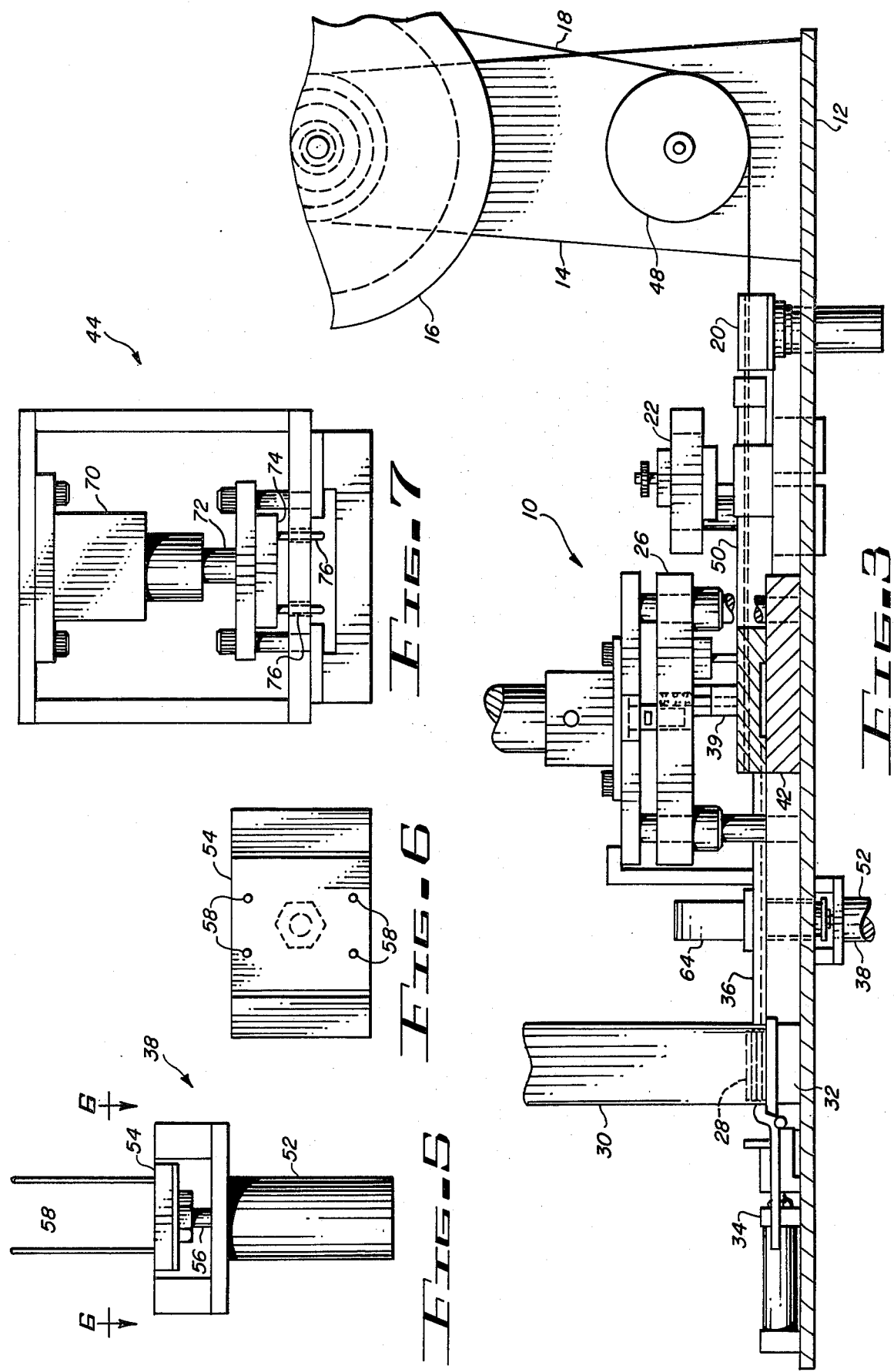

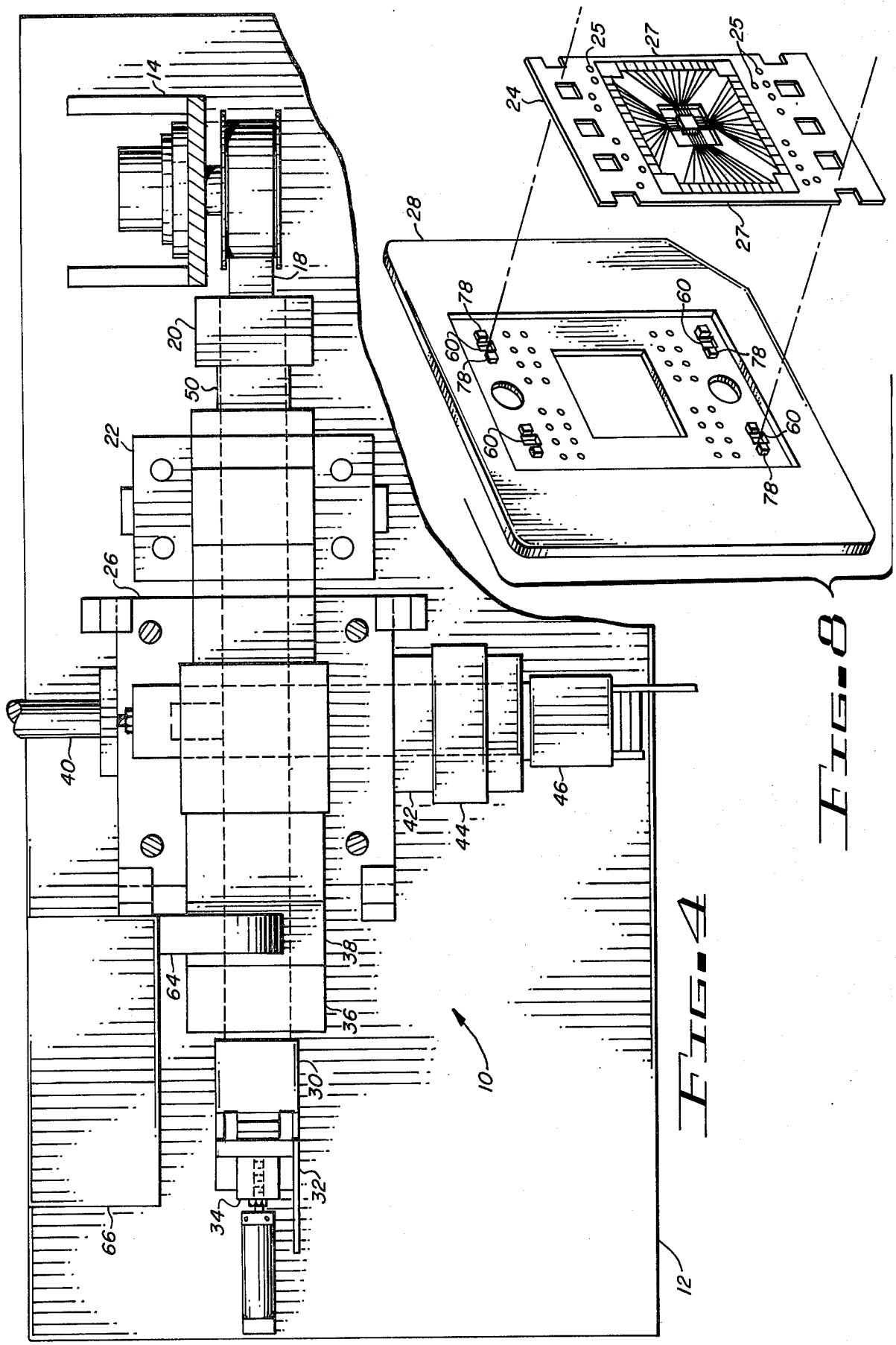

AUTOMATION SYSTEM FOR MOUNTING FILM SEGMENTS INTO FIXTURES

CROSS REFERENCE TO RELATED PATENTS AND APPLICATIONS

The following patents and applications are incorporated by reference into the subject application all of which are assigned to the same assignees as the instant invention; namely, Honeywell Information Systems, Inc.
- A. U.S. Pat. No. 4,043,485 which issued on Aug. 23, 1977 and is entitled "Magazine for a Plurality of Fixtures Holding Integrated Circuit Chips" by Kenneth Boyd Tippetts
- B. U.S. Pat. No. 4,068,767 which issued on Jan. 17, 1978 and is entitled "Transfer Mechanism" by Kenneth Boyd Tippetts.
- C. U.S. Pat. No. 4,069,496 which issued on Jan. 17, 1978. and is entitled "Reusable Fixture for an Integrated Circuit Chip" by John Lawrence Kowalski.
- D. U.S. Pat. application No. 921,640 filed July 3, 1978 entitled "Apparatus for Cutting a Segment from a Strip of Film and Mounting the Segment in a Fixture" by Max Avalon.
- E. U.S. Pat. application No. 921,664 filed July 3, 1978 entitled "Coding System" by Kenneth Boyd Tippetts.

BACKGROUND OF THE INVENTION

This invention is in the field of systems for automating the cutting of segments from a film strip wound on a reel and for loading the severed segments, one at a time, into reusable fixtures and stacking such reusable fixtures in a transferee magazine.

DESCRIPTION OF THE PRIOR ART

The development of integrated circuits (I.C.) chips, particularly medium and large scale I.C. chips, has created a need for improved manufacturing processes to automate the mounting of such chips on substrates or in packages. It is known to attach I.C. chips to lead frames formed on relatively long strips of a tape-like carrier similar to standard motion picture film. The lead frames are formed from a thin metalic layer of a suitable electrical conductor, such as copper, which is bonded to the film. The strip is divided into equal sized segments, and the layer of metal within each segment is formed into lead frames of a desired configuration by conventional photo etching processes. Subsequently, I.C. chips are bonded to each lead frame. The length of such strips of film are such that to facilitate handling and shipping the strips are wound on reels with appropriate layers of protective material on either side of the film strip to protect the I.C. chips mounted on the lead frames of each segment. As a general rule, I.C. chips of the same type are mounted on the lead frames of the segments of a given film strip.

Reusable fixtures suitable for use with the apparatus of this invention for holding a segment of a film strip on which an I.C. chip is mounted, for example, are described and claimed in the U.S. Pat. No. 4,069,496 hereafter identified as "Patent C", which is further identified in paragraph C of the section of this application entitled "Cross Reference to Related Patents and Applications", which patent is assigned to the same assignee as the present invention.

Apparatus such as punch presses, for cutting a segment of a film strip to which segment an I.C. chip is bonded at the boundaries between the segments are known. Also apparatus exists for fastening, or mounting, such a segment in a reusable fixture by forcing the attachment webs of a segment which attachment webs are located between adjacent attachment sprocket holes of the segment between attachment lugs of the fixture. However, a system for cutting a segment from a film strip having a large number of such segments all of equal size wound on a reel, for applying identification data in digital form to the segments, for cutting the segments and loading them into reusable fixtures which are supplied to the system from a transferor magazine and for loading the reusable fixtures with segments mounted on them into a transferee magazine has not heretofore existed.

SUMMARY OF THE INVENTION

The present invention provides a system for cutting a segment from a strip of film which film strip is comprised of a plurality of substantially equal size segments and which film in turn is wound on a reel and for mounting each segment as severed on a reusable fixture. The fixtures each with a segment mounted on it, or stacked in a transferor magazine for subsequent use in the process of manufacturing useful electronic devices using the I.C. chips mounted on segments. The system has a reel mount secured to a base plate on which the reel of film can be placed. A film advance mechanism through which the film is threaded, engages the sprocket holes on both sides of the film to advance the film one segment at a time under the control of either the operator or an appropriate control system. At a first station the film has applied to it identification data of the integrated circuit mounted on the segment. The data is applied by a coding subsystem which is described and claimed in the application identified in paragraph E of the section of this application entitled "Cross Reference to Related Applications" hereafter "Application E". After the binary, machine readable identification data is applied to a segment, the film strip is advanced through the film guide means until the film is positioned in the loading subsystem so that a segment is in a position to be severed by the loading subsystem which is described and claimed in the application identified in paragraph D of the section of this application entitled "Cross Reference to Related Applications" hereafter "Application D". At the same time that the film strip is being advanced or supplied to the loading subsystem, reusable fixtures are being removed one at a time from the bottom of a stack of such fixtures stored in a transferor magazine and advanced by a fixture actuator through a fixture guide. At a first station on the fixture guide, a segment ejector is positioned to forcibly remove any segment that may be attached to a reusable fixture. Thus, any fixture which had a segment mounted on it, will have the segment removed as it moves through the segment ejector so that no segment is attached to a fixture after passing through the segment ejector. The fixtures are then advanced in steps with each step being substantially equal to the length of a fixture until a fixture is located in the loading subsystem. During each cycle of operation of the loading subsystem as is described more fully in the Application D, a severed segment will be mounted in a fixture. The reusable fixture with the segment mounted on it, is then moved from the loading system by a second fixture actuator into a second fixture guide. At a first station on the second fixture guide the fixture has forces applied to the attachment webs between pairs of attachment sprocket holes of the segment to force the connecting web between the protuberances on the attachment lugs of the fixture to make certain that the segment is firmly attached to the fixture.

Subsequently the fixtures are inserted into the bottom of a transferee magazine and stacked vertically in the transferee magazine. After a reasonable number of fixtures have been collected in the transferee magazine, or until all the segments of the film strip have been separated from each other, the fixtures in the magazine together with the I.C. chips mounted on the segments are ready for use in subsequent manufacturing operations.

The present invention solves a prior art problem of providing an automation system which permits the use of strips of film wound on reels as the source of segments to which segments are secured I.C. chips. The film strip passes through a coding subsystem so that identification data can be applied to the segments to identify the I.C. chips. The segments are then separated, or severed, from the strip and loaded into reusable fixtures sequentially. The fixtures to be loaded are supplied from a transferor magazine, and after a segment has been loaded into a reusable fixture in a single cycle of operation of the loading subsystem, the fixture with a segment mounted on it is then moved to a seating mechanism. The seating mechanism applies force to the attachment webs of each segment to increase the probability that each segment is securely attached to its fixture. The fixtures are then loaded into a transferee magazine for subsequent use.

It is therefore the object of this invention to provide an improved automation system for cutting segments from a strip of such segments for mounting the severed segments into a reusable fixture, and, for stacking such reusable fixtures in a transferee magazine.

It is further object of this invention to provide an improved automation system which includes apparatus for applying identification data to segments of a film strip as they are unwound from a reel; for severing the segments, one at a time; for loading each segment into a reusable fixture; and for stacking the fixtures with a segment mounted on each in a transferee magazine.

It is yet another object of this invention to provide a system for automating the manufacturing process of mounting segments in reusable fixtures reliably and at an increased rate of production so that the overall cost of manufacturing electronic system utilizing such integrated circuit chips is minimized.

BRIEF DESCRIPTION OF THE DRAWINGS

Other objects, features and advantages of the invention will be readily apparent from the following description of the preferred embodiment, taken in conjunction with the accompanying drawings, although variations and modifications may be effected without departing from the spirit and scope of the novel concepts of the disclosure and in which:

FIG. 3 is a section taken on line 3—3 of FIG. 2;

FIG. 4 is a plan view of the invention;

FIG. 5 is a side elevation of a segment ejector;

FIG. 6 is a section taken on line 6—6 of FIG. 5;

FIG. 7 is a side elevation of the secondary seating station;

FIG. 8 is an isometric view of a reusable fixture with a segment exploded therefrom.

DESCRIPTION OF THE PREFERRED EMBODIMENT

Figure 1:
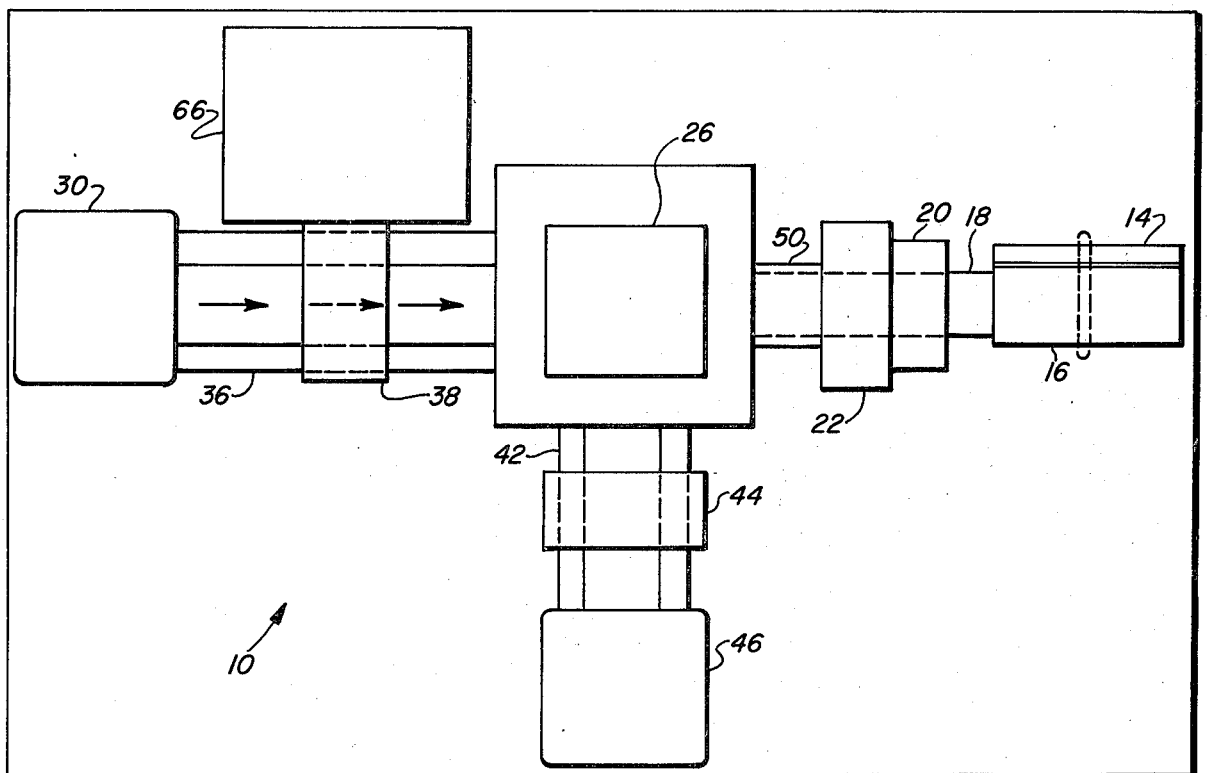
FIG. 1 is a schematic diagram of the automation system of the invention.
Figure 2:
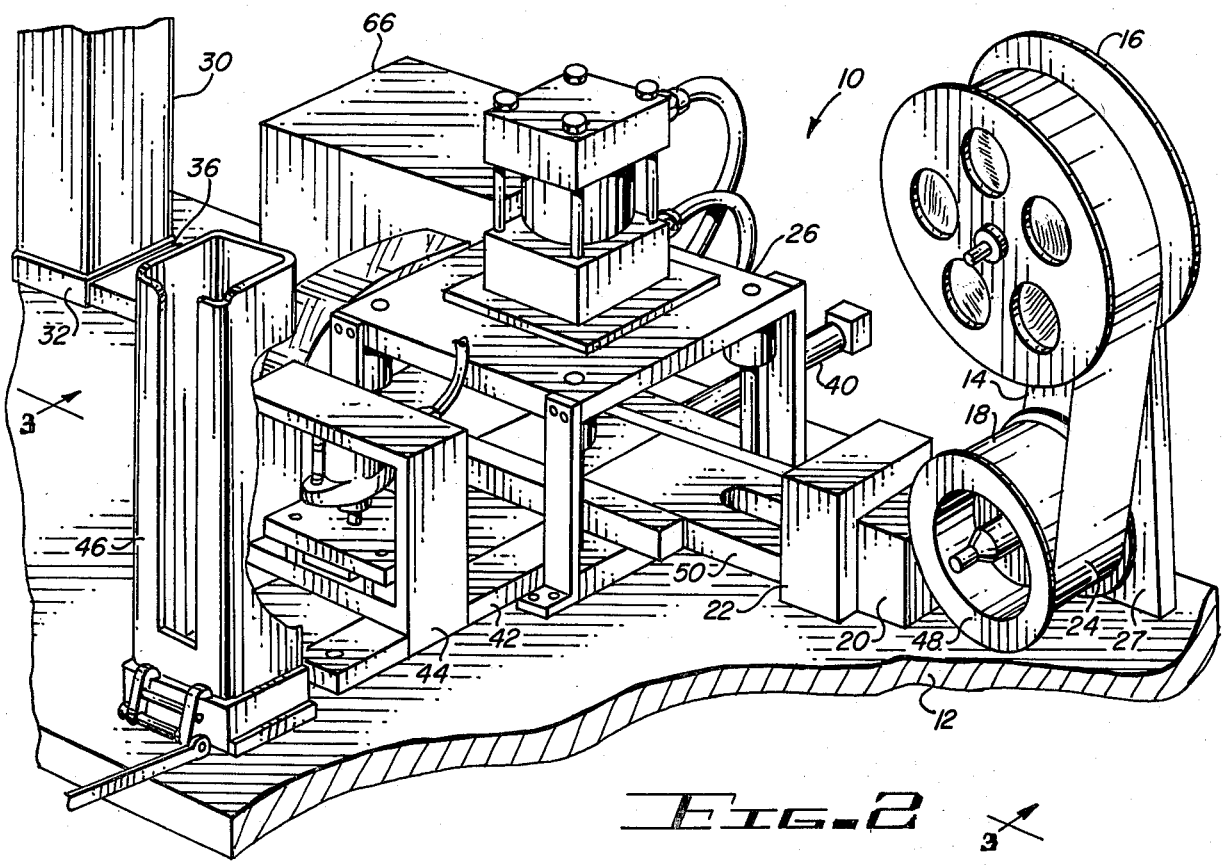
FIG. 2 is a perspective view of the system of the invention.

In FIGS. 1&2 automation system 10 has a base plate 12 to which is secured a reel mount 14. Reel 16 is removably mounted on reel mount 14. Reel 16 can be a commercially available reel for 35 mm motion picture film. Wound on reel 16 is a strip of film 18, 35 mm film in the preferred embodiment, which is threaded through a conventional film advance, or stepping, mechanism 20. Film strip 18 is advanced by mechanism 20 step by step in steps of substantially equal size to coding subsystem 22 which is described and claimed in Application E. Coding subsystem 22 applies data to each segment 24 into which the film strip 18 is divided by selectively forming data holes 25 in the coding blocks of each segment 24 as described in Application E. Details of a segment 24 relevant to this Application are illustrated in FIG. 8. Film strip 18 is advanced through coding subsystem 22 by film advance mechanism 20 and supplied or fed into loading subsystem 26 which is described and claimed in Application D. The function of loading subsystem 26 is to cut a segment 24 from film strip 18, one segment at a time, at a segment boundary 27 there being a segment boundary between each segment 24, and to load each segment 24 as severed from strip 18 into a reusable fixture 28 which is also illustrated in FIG. 8 Reusable fixture 28 is described and claimed in Patent C.

Reusable fixtures 28 are stacked in a transferor magazine 30. Transferor magazine 30 is described and claimed in the U.S. Patent identified in paragraph A of the section of this Application entitled "Cross Reference to Related Patents and Applications", hereafter Patent A. Magazine 30, as can be seen in FIG. 2 is removably mounted on magazine base 32. Transfer mechanism 34 for removing reusable fixtures 28 stacked in transferor magazine 30 is described and claimed in U.S. Patent identified in paragraph B of the section of this Application entitled "Cross Reference to Related Patents and Appications", hereafter Patent B. Reusable fixture transfer mechanism 34 which can be seen in FIG. 3 will advance a reusable fixture 28 through fixture guide 36 toward loading subsystem 26 a step at a time, the length of each step being substantially equal to the length of a fixture.

At a predetermined position, or station, of fixture guide 36 a segment ejector 38 is located which forcibly removes or detaches any segment that is attached, or mounted, on a reusable fixture 28 removed from transferor magazine 30. After passing through segment ejector 38 each reusable fixture 28 is advanced one step at a time until it is positioned in loading subsystem 26 directly under punch 39 of loading subsystem 26 as can be best seen in FIG. 3 so that a segment 24, as it is severed from film strip 18 in a cycle of operation of loading subsystem 26 will be mounted on reusable fixture 28 as described and illustrated in detail in Application D. After a segment 24 is mounted on a reusable fixture 28 a second fixture advance mechanism 40, will cause the fixture and its attached segment to move, a step at a time, with each step substantially equaling the length of a segment, into a second fixture guide 42 until the fixture and its segment are located at a first predetermined position or station in fixture guide 42 within secondary mounting, or seating mechanism 44. Mechanism 44 applies force to the attachment webs 45 of a segment 24 to increase the probability that each segment is attached to the fixture 28 on which it is mounted. After a fixture 28 and its segment 24 passes through seating mechanism 44, reusable fixture 28 is advanced through fixture guide 42 and loaded into transferee magazine 46 where each fixture 28 is stacked vertically in sequence within magazine 46 as described in more detail in Patent B.

In FIG. 2, which is a perspective view of automation system 10, it should be noted that film strip 18, which is divided into substantially equal sized segments 24, is wound around reel 16, which is mounted on reel mount 14. Pully 48 is also mounted on reel mount 14 to guide film strip 18 into film advance mechanism 20. Film advance mechanism 20 will cause film strip 18 to advance one segment at a time in steps equal to the length of a segment 24. In the preferred embodiment, film strip 18 is standard 35 mm film with two rows of sprocket holes along each side of the film, and each segment 24 has a length of approximately 17½ mm. Obviously, segments 24 could have other dimensions and still be within the scope of this invention.

Film advance mechanism 20 will advance film strip 18 one segment at a time during each cycle of operation of mechanism 20 in steps of a length of substantially 17½ mm in the preferred embodiment through film guide 50 until a segment 24 is properly positioned within coding system 22 where binary data in the form of data holes 25 are punched in coding areas of each segment to identify in a preferred embodiment the integrated circuit chip that is mounted on the lead frame of each segment 24 of film strip 18 as described in detail in Application E. After the identification data is applied to each segment 24 during a cycle of operation of coding subsystem 22, film strip 18 is advanced one segment at a time until after a number of such steps, depending on the distance between coding system 22 and loading subsystem 26, the first segment of a film strip 18 will be positioned in loading system 26 so that the first segment 24 can be severed from strip 18 at its segment boundary and loaded into a reusable fixture 28 as described in detail in Application D.

The fixtures 28 stacked in transferor magazine 30, since they are reusable, most likely are placed in magazine 30 after having been used before. Thus there is a high probability that some of the fixtures 28 stacked in transferor magazine 30 will have at least a part of a segment 24 still attached or mounted on them. Fixture transfer mechanism 34 will remove the reusable fixtures 28, one fixture at a time, from transferor magazine 30 and advance them into fixture guide 36, and after a certain number of cycles of operation of mechanism 34 a fixture 28 will be positioned in segment ejector 38 as can be seen in FIG. 3.

Details of segment ejector 38 are illustrated in FIGS. 5 and 6. Segment ejector 38 has an actuator 52, and a movable holder 54, which is attached to cylinder rod 56 of actuator 52. Mounted on holder 54 are four ejector pins 58 which are positioned as illustrated in FIG. 6 so that each ejector pin 58 can be projected through a detachment opening 60 of the fixture 28 as seen in FIG. 8. Movement of holder 54 in an upward direction as seen in FIG. 3 during each cycle of operation of segment ejector 38 to cause ejector pins 58 to penetrate through detachment openings 60 of the fixture 28 and contact the attachment webs 45 of any segment 24 that may be attached to or mounted on a reusable fixture 28 positioned properly within segment ejector 38 and forcibly detaches the segment from the fixture. A segment ejector housing 64 seen in FIG. 3 is provided which is connected to a source of vacuum, or air at less than atmospheric pressure. Air flows through segment ejector 38 to draw off or remove, any loosened segment and deposit the segment in scrap bin 66 schematically illustrated in FIG. 1.

After passing through segment ejector 38, each reusable fixture 24 is advanced in stepwise manner until a fixture is positioned directly under the punch 39 of the loading subsystem 26. At the completion of a cycle of operation of loading subsystem 26 a segment 24 positioned under punch 39 has been loaded into a fixture 28 which is also under punch 39 by loading subsystem 26. Before loading subsystem 26 is activated to conduct its next cycle of operation, second fixture advance mechanism 40 will advance or move the fixture 28 into which a segment 24 has just been loaded in the previous cycle of operation of loading subsystem 26 into second fixture guide 42 which clears the space directly under the punch 39 so that the first fixture transfer mechanism 34 can advance a reusable fixture 28 from which any remnants of a segment 24 have been removed by segment ejector 38 into position under punch 39 so that the next segment 24 severed from film strip 18 can be loaded into it in the next cycle of operation of loading subsystem 26. Each reusable fixture 28 with a segment 24 mounted on it by loading subsystem 26 is then advanced during each cycle of operation of second fixture advance mechanism 40 until it is properly positioned with respect to secondary loading, or seating, mechanism 44 which is illustrated in FIG. 7.

Seating mechanism 44 has an actuator 70. Piston rod 72 of actuator 70 has attached to it holder 74. Sealing, or attachment pins 76, four in number, are mounted on holder 74 and have in essentially the same position relative to holder 74 and to one another as ejector pins 58 have with respect to holder 54 of segment ejector 38. The function of seating mechanism 44 is to increase the probability, that each segment 24 of film strip 18 loaded or mounted on a fixture 28 in a cycle of operation of loading subsystem 26 has its atttachment webs 45 positioned between the projections or lugs 78 with which the reusable fixtures are provided with the protrusions formed on the lugs 78 overlying the attachment webs 48 of segment 24 as described in Patent C. After passing through seating mechanism 44 each reusable fixture 28 is advanced and loaded into transferee magazine 46 where they are stacked vertically within magazine 46 as is described more fully in Patent B.

In operation the operator will position reel 16 on which is wound a strip of film 18 which in the preferred embodiment will be divided into segments 24 with each segment 24 having formed on it a lead frame with an IC chip attached to the lead frame as described in the prior art. Typically, all of the I.C. chips on a given strip of film 18 will be of the same type. The operator will set the coding subsystem 22 to punch the digital information into each segment 24 to identify the integrated circuit chip type attached to the segment. Film strip 18 is then threaded through film advance mechanism 20 which is in the preferred embodiment a standard mechanism for advancing 35 mm film, through a distance equal to one-half of a frame, or one segment 24, each time mechanism 20 is energized or during each cycle of its operation. The operator will also place a transferor magazine 30 in which has been loaded with properly oriented reusable fixtures 28 as described and claimed in the Patent A and mount the transferor magazine 30 on base 32.

When system 10 is in operation, film strip 18 will be advanced one segment at a time until the first segment 24 is positioned within coding subsystem 22 where appropriate machine readable identification data will be applied to the segment. Film strip 18 will continue to be advanced by film advance mechanism 20 until the first segment 24 is properly positioned within loading subsystem 26. Essentially at the same time as film strip 18 is being advanced a step at a time, or in synchronization therewith, a reusable fixture 28 will be advanced one fixture at a time from transferor magazine 30 by fixture transfer mechanism 34. Each fixture 28 will be moved into segment ejector 38 where a segment 24 if mounted on the fixture will be removed. From segment ejector 38 each fixture will be moved to loading subsystem 26 so that a segment 24 and a reusable fixture 28 will be properly positioned in loading subsystem 26 prior to loading subsystem 26 beginning a cycle of operation, i.e., punch 39 is at its uppermost position so that a film strip 18 can be advanced under punch 39 without interference. Second fixture advance mechanism 40 will during each of its cycles of operation move a fixture 28 into which a segment is loaded during a cycle of operation of loading subsystem 26 into the second fixture guide 42 so that no fixture 28 is positioned directly under the punch 39 at the time the first fixture transfer mechanism is energized or cycled to advance a fixture one step, which step is substantially equal to the length of a fixture, two inches in the preferred embodiment, in fixture guide 36.

A reusable fixture 28 with a segment 24 mounted on it, by loading system 26 will then be advanced by the second fixture advance mechanism to secondary loading mechanism 44 where during each cycle of operation of mechanism 44, attachment pins 76 will apply force to attachment webs 45 of each segment properly positioned with respect to mechanism 44 so that the projections on the lugs 78 of each fixture 28 will overlie the attachment webs. In subsequent cycles of operation of the second fixture advance mechanism 40 a fixture will be loaded one fixture at a time into transferee magazine 46 where the fixtures 28 with a segment 24 attached to each will be stacked vertically.

From the foregoing, it is believed obvious that the Applicants have provided an Automation System for severing segments from a film strip on which segments may be mounted integrated chips, for loading the segments into reusable fixtures, and for stacking the segments in a magazine with a minimum risk of damage to the IC chips mounted on the segments, which system increases productivity and reduces the cost of manufacturing processes using IC chips mounted on flexible beam lead frames of the type described.

Fixture actuators 34 and 40, film advance mechanism 20, segment ejector 38, coding subsystem 22, loading subsystem 26 and seating mechanism 44 are, in the preferred embodiment, pneumatically powered, although they could be powered by other conventional sources of power, such as hydraulic or electric power, if desired and each has a cycle of operation; i.e., cylinder rod 56 of actuator 52 or piston rod 72 of actuator 70 is extended and retracted once during a cycle of operation thereof and repetitively thereafter during each such cycle of operation, the occurence of which is controlled or timed by the application of power through conventional commercially available electrically controlled pneumatic valves in the preferred embodiment. The control means 80 for system 10 can be controlled manually by an operator and which switches are connected by wires to the electrically controlled valves to control the film advance mechanism, reusable fixture actuators 34, 40 segment ejector 38, coding subsystem 22, loading subsystem 26 and sealing mechanism 44. Control means 80 in the preferred embodiment is a conventional sequencer such as the Model No. 5T1 Programmer supplied by Texas Instruments Co. which permits system 10 to be operated semi-automatically or automatically. In addition, control means 80 could be means for producing signals from a punched paper tape, from a magnetic tape or from a microcomputer.

It should be evident from the foregoing that various modifications can be made to the described embodiment without department from the scope of the present invention.

What is claimed is:

1. In combination:
   a reel, said reel adapted to have a strip of film having a plurality of equal sized segments wound thereon;
   film advance means having a cycle of operation adapted to advance a strip of film a segment at a time during each cycle of operation;
   film guide means through which a strip of film is adapted to advance;
   loading means having a cycle of operation, said loading means during each cycle of operation adapted to sever a segment, one segment at a time from a strip of film as each segment occupies a predetermined position with respect to the film guide means, and to load a severed segment into a fixture;
   a transferor magazine adapted to have a plurality of fixtures stacked in said magazine;
   first fixture guide means;
   first fixture transfer means having a cycle of operation adapted to remove one fixture at a time from the transferor magazine and moving a fixture so removed into the first fixture guide means during each cycle of operation;
   said loading means adapted to load a severed segment into a fixture occupying a predetermined position with respect to said first fixture guide means during each cycle of operation of the loading means;
   second fixture guide means;
   second fixture transfer means having a cycle of operation adapted to remove a fixture occupying said predetermined position in said first guide means and to move said fixture into the second fixture guide means during each cycle of operation of said second fixture transfer means;
   a transferee magazine removably mounted with respect to the second fixture guide means so that fixtures loaded with segments by loading means are loaded one at a time into said transferee magazine and stacked therein one fixture during each cycle of operation of said second fixture transfer means; and
   control means for causing the cycles of operation of the film advance means, the loading means, the first fixture transfer means and the second fixture transfer means to occur so that segments from a strip of film are loaded into fixtures and such fixtures are stacked in the transferee magazine.

2. In combination:

a reel, said reel adapted to have a strip of film having a row of sprocket holes along each side of the film and a plurality of equal sized segments wound thereon;
means adapted to engage the sprocket holes of a strip of film for advancing a strip of film in steps, the length of the steps substantially equaling the length of a segment;
film guide means through which a strip of film is adapted to advance;
means adapted to apply data to each segment as it occupies a first predetermined position in said film guide means;
primary loading means adapted to sever a segment, one segment at a time, from a film strip as each segment occupies a second predetermined position with respect to the film guide means, and adapted to load a severed segment, one segment at a time into a fixture;
a transferor magazine adapted to have a plurality of fixtures stacked in said magazine;
first fixture guide means;
first fixture actuating means adapted to remove a fixture from the transferror magazine one fixture at a time and to move a fixture into the first fixture guide means;
means adapted to remove a segment mounted in a fixture when a fixture occupies a first predetermined position in said fixture guide means;
said fixture actuating means after a predetermined number of cycles of operation adapted to place a fixture in a second predetermined position in said first fixture guide means where said loading means can load a severed segment into a fixture;
secondary loading means;
second fixture guide means;
second fixture actuating means adapted to move a fixture onto which a segment has been loaded into said second fixture guide means from said second predetermined position in said first fixture guide to a predetermined position in said second fixture guide means so that the secondary loading means can apply force to a segment mounted on a fixture by the primary loading means to increase the probability that the segment is properly loaded into its fixture; and
a transferee magazine mounted with respect to said second fixture guide means adapted to have fixtures, each of which is loaded with a segment, loaded sequentially into the transferee magazine by the second fixture actuating means.

3. The combination of claim 5 in which the means for advancing a strip of film, the means adapted to apply data to each segment, the primary loading means, the first and second fixture actuating means, the means adapted to remove a segment and the secondary loading means, are pneumatically powered.

4. In combination:
a reel, said reel adapted to have a film strip having a plurality of equal sized segments each segment being substantially the same length and having attachment webs wound thereon;
film guide means through which a film strip is adapted to advance;
film stepping means having a cycle of operation, said film stepping means adapted to advance a film strip through the film guide means during each cycle of operation thereof;
coding means having a cycle of operation, said coding means adapted to apply binary data to a segment of a film strip as a segment occupies a predetermined first position in said film guide means during each cycle of operation thereof;
loading means having a cycle of operation, said loading means adapted to sever a segment from a film strip, one segment at a time, as a segment occupies a second predetermined position with respect to the film guide means, and for mounting a severed segment into a fixture during each cycle of operation of the loading means;
a transferor magazine adapted to have a plurality of fixtures stacked in said magazine, each fixture having a length and a width, said fixtures being of substantially equal size and having a plurality of attachment openings;
first fixture guide means;
first fixture advancing means having a cycle of operation, said first fixture advancing means adapted to remove a fixture from the transfer magazine and advancing a fixture into the first fixture guide means a distance substantially equal to the length of a fixture during each cycle of operation;
segment ejector means having a cycle of operation adapted to remove a segment mounted in a fixture when a fixture occupies a first predetermined position in said first fixture guide means during a cycle of operation of the segment ejector means;
said loading means adapted to load a severed segment into a fixture advanced to and occupying a second predetermined position in said first fixture guide means during each cycle of operation thereof;
second fixture guide means;
second fixture advancing means having a cycle of operation adapted to advance a fixture occupying said second predetermined position in said first fixture guide means a distance substantially equal to the length of a fixture during each cycle of operation into said second fixture guide means;
seating means having a cycle of operation, said seating means adapted to apply a force to a segment mounted on a fixture when the fixture occupies a first predetermined position in the second fixture guide means to increase the probability that a segment is properly loaded into its fixture;
a transferee magazine positioned with respect to the second fixture guide means adapted to have fixtures with segments mounted thereon by the loading means sequentially stacked into said transferee magazine one at a time by said fixture advancing means, during a cycle of operation of said second fixture advancing means; and
sequencing means for causing the cycle of operation of the film stepping means, the coding means, the loading means, the first and second fixture advancing means, and the seating means to occur so that segments from a strip of film are mounted on fixtures and the fixture stacked in the transfer magazine.

5. The combination of claim 4 in which the seating means comprises an actuator having a piston rod, a holder mounted on the piston rod and a plurality of seating pins, said seating pins adapted to apply force to the attachment webs of a segment mounted on a fixture.

6. The combination of claim 5 in which the segment ejector means comprises an actuator having a piston rod, a holder mounted on the piston rod and a plurality of ejector pins; said ejector pins adapted to apply force to the attachment webs of a segment through the attachment openings in each fixture to detach a segment mounted thereon.

7. The combination of claim 6 in which the number of seating pins and ejector pins is four.

8. In combination: a reel, said reel adapted to have a strip of film wound on it, said strip of film being divided into a plurality of equal sized segments;

film advance means having a cycle of operation adapted to advance a strip of film a segment at a time during each cycle of operation;

film guide means through which a strip of film is adapted to advance;

loading means having a cycle of operation, said loading means during each cycle of operation adapted to sever a segment, one segment at a time from a strip of film as each segment occupies a predetermined position with respect to the film guide means, and to load a severed segment, a segment at a time, into a fixture;

a transferor magazine, said transferor magazine adapted to have a plurality of fixtures stacked in said magazine;

first fixture guide means;

first fixture transfer means having a cycle of operation adapted to remove a fixture at a time from the transferor magazine and to move a fixture into the first fixture guide means means during each cycle of operation;

said loading means adapted to load a severed segment into a fixture occupying a predetermined position with respect to said first fixture guide means during each cycle of operation of the loading means;

second fixture guide means;

second fixture transfer means having a cycle of operation adapted to remove a fixture occupying said predetermined position in said first guide means and to move a fixture into the second fixture guide means during each cycle of operation of said second actuator means;

a transferee magazine removably mounted with respect to the second fixture guide means adapted to have a fixture stacked in said transferee magazine by said loading means during each cycle of operation of said second actuator means; and control means for causing the cycles of operation of the film advance means, the loading means, the first fixture transfer means and the second fixture transfer means to occur so that segments from a strip of film are loaded into fixtures and the fixtures stacked in the transferee magazine.

9. In the combination of claim 1 in which the film advance means, the loading means, the first fixture transfer means, and the second fixture transfer means include pneumatic means to provide power thereto.

* * * * *